(12) United States Patent
Liu

(10) Patent No.: US 11,705,740 B2
(45) Date of Patent: Jul. 18, 2023

(54) BATTERY PACK AND CHARGING MANAGEMENT METHOD THEREOF

(71) Applicant: Nanjing Chervon Industry Co., Ltd., Nanjing (CN)

(72) Inventor: Jianan Liu, Nanjing (CN)

(73) Assignee: Nanjing Chervon Industry Co., Ltd., Nanjing (CN)

( * ) Notice: Subject to any disclaimer, the term of this patent is extended or adjusted under 35 U.S.C. 154(b) by 166 days.

(21) Appl. No.: 17/181,030

(22) Filed: Feb. 22, 2021

(65) Prior Publication Data

US 2021/0281083 A1 Sep. 9, 2021

(30) Foreign Application Priority Data

Mar. 4, 2020 (CN) .......................... 202010143720.9

(51) Int. Cl.
*H02J 7/00* (2006.01)
*G01R 31/389* (2019.01)
*G01R 27/08* (2006.01)

(52) U.S. Cl.
CPC ............ *H02J 7/0014* (2013.01); *G01R 27/08* (2013.01); *G01R 31/389* (2019.01); *H02J 7/0024* (2013.01)

(58) Field of Classification Search
CPC ...... H02J 7/0014; H02J 7/0024; H02J 7/0047; H02J 7/007; H02J 7/0016; G01R 27/08; G01R 31/389; Y02E 60/10; H01M 10/4207; H01M 10/4257; H01M 10/441; H01M 2010/4271
USPC ....................................................... 320/134
See application file for complete search history.

(56) References Cited

U.S. PATENT DOCUMENTS

| 7,358,704 B2 * | 4/2008 | Yumoto | G01R 31/367 702/182 |
| 8,648,570 B2 * | 2/2014 | Lim | H02J 7/0016 320/118 |
| 9,711,976 B2 * | 7/2017 | Abe | H01M 10/441 |
| 9,770,997 B2 * | 9/2017 | Lin | H02J 7/0014 |
| 10,551,468 B2 * | 2/2020 | Nishijima | G01R 31/3842 |

(Continued)

FOREIGN PATENT DOCUMENTS

| CN | 105759221 A * | 7/2016 | ............. G01R 27/02 |
| DE | 102015212328 A1 * | 1/2017 | ........... G01R 31/367 |

(Continued)

OTHER PUBLICATIONS

English Translation of WO 2020022463 A1 Okabe et al., (Okabe) (Year: 2020).*

(Continued)

*Primary Examiner* — M Baye Diao
(74) *Attorney, Agent, or Firm* — Greenberg Traurig, LLP

(57) ABSTRACT

A battery pack includes a plurality of cells and a control module. The control module is configured to acquire internal resistance of each of the plurality of cells, acquire a terminal voltage of each of the plurality of cells in real time in a case where the plurality of cells are charged with a constant current, determine an electromotive force of each of the plurality of cells based on the internal resistance of each of the plurality of cells and a charging current and the terminal voltage, determine a target cell from the plurality of cells based on the electromotive force of each of the plurality of cells, and perform charging balancing management on the target cell.

12 Claims, 2 Drawing Sheets

(56) References Cited

U.S. PATENT DOCUMENTS

| | | | |
|---|---|---|---|
| 10,897,143 B2 * | 1/2021 | Zou | H02J 7/0016 |
| 11,146,077 B2 * | 10/2021 | Jeong | H03K 5/24 |
| 11,275,125 B2 * | 3/2022 | Yang | G01R 31/3842 |
| 2006/0273761 A1 * | 12/2006 | Arai | G01R 31/3842 320/132 |
| 2010/0277123 A1 * | 11/2010 | Lim | H02J 7/0016 320/116 |
| 2011/0210701 A1 * | 9/2011 | Nakamura | H02J 7/0018 320/118 |
| 2012/0161707 A1 * | 6/2012 | Kim | H02J 7/0016 320/118 |
| 2012/0274283 A1 * | 11/2012 | Van Lammeren | H01M 10/441 320/118 |
| 2013/0088201 A1 | 4/2013 | Iwasawa et al. | |
| 2013/0187608 A1 * | 7/2013 | Yen | H02J 7/0016 320/118 |
| 2014/0361743 A1 * | 12/2014 | Lin | B60L 58/15 320/109 |
| 2015/0316636 A1 * | 11/2015 | Nishijima | G01R 31/3648 702/58 |
| 2017/0113564 A1 | 4/2017 | Unno et al. | |
| 2017/0264123 A1 * | 9/2017 | Mulawski | H02J 9/062 |
| 2018/0262021 A1 * | 9/2018 | Kim | H02J 7/0014 |
| 2020/0067324 A1 * | 2/2020 | Zou | H01M 10/441 |

FOREIGN PATENT DOCUMENTS

| | | | | |
|---|---|---|---|---|
| EP | 3846278 A1 * | 7/2021 | | G01R 31/3835 |
| WO | WO-2020022463 A1 * | 1/2020 | | G01R 31/389 |
| WO | WO-2020028485 A1 * | 2/2020 | | H01M 10/052 |

OTHER PUBLICATIONS

EPO, extended European search report issued on EP publication No. 3876384A1, dated Aug. 4, 2021, 8 pages.

* cited by examiner

BATTERY PACK AND CHARGING MANAGEMENT METHOD THEREOF

RELATED APPLICATION INFORMATION

This application claims the benefit of CN 202010143720.9, filed on Mar. 4, 2020, the disclosure of which is incorporated herein by reference in its entirety.

BACKGROUND

The current mainstream balancing method for a battery pack is to detect a terminal voltage of a single cell and determine a cell to be balanced according to a difference between terminal voltages of cells in a cell charging process. This balancing method has the following disadvantage: after the battery pack is used for a long time, a difference in internal resistance between cells increases; in the cell charging process, the difference in internal resistance causes a difference between the terminal voltages of the cells so that an error may exist when balancing determination is directly performed according to the terminal voltages of the cells, that is, the cell needs to be balanced is determined incorrectly, which reduces the accuracy and reliability of balanced charging.

SUMMARY

In a first aspect, an example battery pack includes a housing and a cell group and a control module that are disposed in the housing.

The cell group is configured to output a power signal.

The control module is configured to acquire internal resistance of each cell in the battery pack; acquire a terminal voltage of each cell in real time in a case where cells are charged with a constant current; determine an electromotive force of each cell based on the internal resistance of each cell and a charging current and the terminal voltage in the case where the cells are charged with the constant current; determine a target cell from the cells based on the electromotive force of each cell; and perform charging balancing management on the target cell.

In a second aspect, an example charging management method includes steps described below.

Internal resistance of each cell in a battery pack is acquired.

A terminal voltage of each cell is acquired in real time in a case where cells are charged with a constant current.

An electromotive force of each cell is determined based on the internal resistance of each cell and a charging current and the terminal voltage in the case where the cells are charged with the constant current.

A target cell is determined from the cells based on the electromotive force of each cell.

Charging balancing management is performed on the target cell.

DETAILED DESCRIPTION

Figure 1:
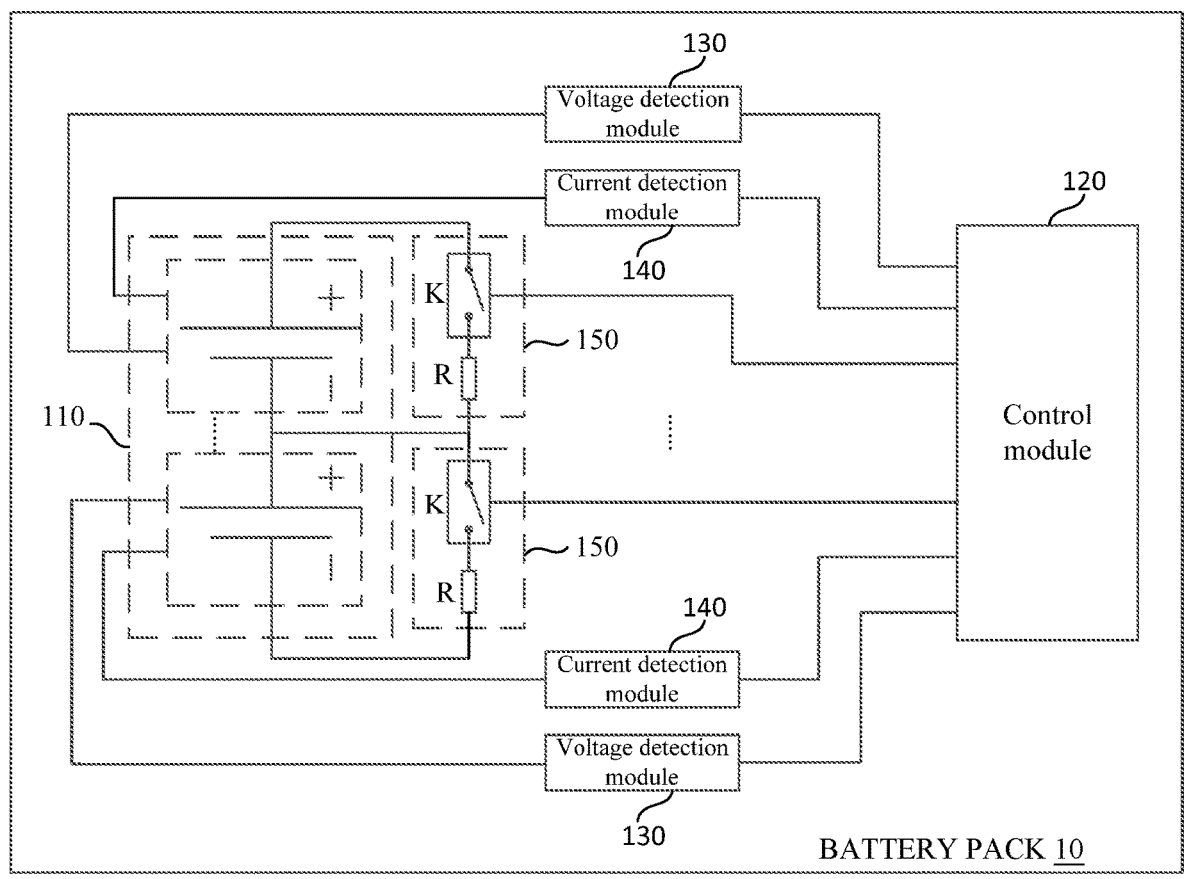
FIG. 1 is a block diagram of a battery pack according to an example of the present disclosure.

A battery pack and charging method is described below in detail in conjunction with drawings and examples. It is to be understood that the examples described herein are merely intended to illustrate and not to limit the claimed invention. In addition, it should be noted that for ease of description, only part of, not all of, the structures related to the present invention are illustrated in the drawings.

The battery pack of the subject disclosure may be applied to an electric power tool such as an angle grinder. The electric power tool is provided with a battery pack coupling part, and the battery pack is coupled to the electric power tool through the battery pack coupling part so that the electric power tool is powered by the battery pack. The voltage of the battery pack is generally 10.8 V, 24 V, 36 V, 48 V, 56 V, or 80 V, which is not limited herein. FIG. 1 is a block diagram of a battery pack according to an example. The battery pack 10 includes a housing and a cell group 110 and a control module 120 are disposed in the housing.

The cell group 110 is disposed in an accommodation space formed by the housing and is configured to output a power signal. Specifically, the cell group is configured to output electric energy to make the electric power tool operate. The cell group 110 further includes multiple cells.

The control module is configured to: acquire internal resistance of each cell in the battery pack; acquire a terminal voltage of each cell in real time in the case where the cells are charged with a constant current; determine an electromotive force of each cell based on the internal resistance of each cell and a charging current and the terminal voltage in the case where the cells are charged with the constant current; determine a target cell from the multiple cells based on the electromotive force of each cell; and perform charging balancing management on the target cell.

Optionally, the control module 120 is specifically configured to perform operations described below.

Current power of the battery pack is compared with a set power threshold.

Charging is stopped in the case where the current power reaches the power threshold.

A voltage variation of each cell is acquired.

The internal resistance of each cell is determined based on the voltage variation and the charging current.

Optionally, the control module 120 is further specifically configured to determine the electromotive force of each cell by the following formula:

$$OCV = U - R*I \qquad (1)$$

where OCV denotes the electromotive force of the cell, U denotes the terminal voltage, I denotes the charging current, and R denotes the internal resistance of the cell.

Optionally, the control module 120 is specifically configured to perform operations described below.

A minimum electromotive force is determined based on the electromotive force of each cell.

A cell whose electromotive force has a difference greater than a set voltage threshold than the minimum electromotive force is determined as the target cell.

Optionally, the control module 120 is specifically configured to perform an operation described below.

The target cell is discharged until a difference between an electromotive force of the target cell and the minimum electromotive force is less than or equal to the set voltage threshold.

Optionally, the control module 120 is specifically configured to perform an operation described below.

A discharge circuit is controlled to be connected to two ends of the target cell, where the discharge circuit includes a discharge resistor.

In an example, to acquire the required terminal voltage and charging current, the battery pack 10 further includes multiple voltage detection modules 130 and multiple current detection modules 140. The control module is connected to the cells through voltage detection circuits and current detection circuits so that the control module can acquire the terminal voltage and the charging current. Specifically, with continued reference to FIG. 1, each cell is connected to the control module through one voltage detection module 130, and the control module detects the voltage of the corresponding cell through the voltage detection module 130.

Each cell is connected to the control module through one current detection module 140, and the control module detects the charging current of the corresponding cell through the current detection module 140.

Optionally, with continued reference to FIG. 1, the battery pack further includes multiple discharge circuits 150 that are connected in correspondence to the cells. One end of each discharge circuit 150 is connected to a positive electrode of its respective cell, and the other end of each discharge circuit 150 is connected to a negative electrode of its respective cell.

Each discharge circuit 150 includes a controllable switch and a resistor that are arranged in series. A control end of the controllable switch is connected to the control module. Each discharge circuit 150 is configured to control its respective cell to be discharged in response to the control module so that the control module can control the corresponding discharge circuit 150 to turn on or off through the controllable switch and perform the charging balancing management on the target cell according to a charging management strategy described below.

Figure 2:
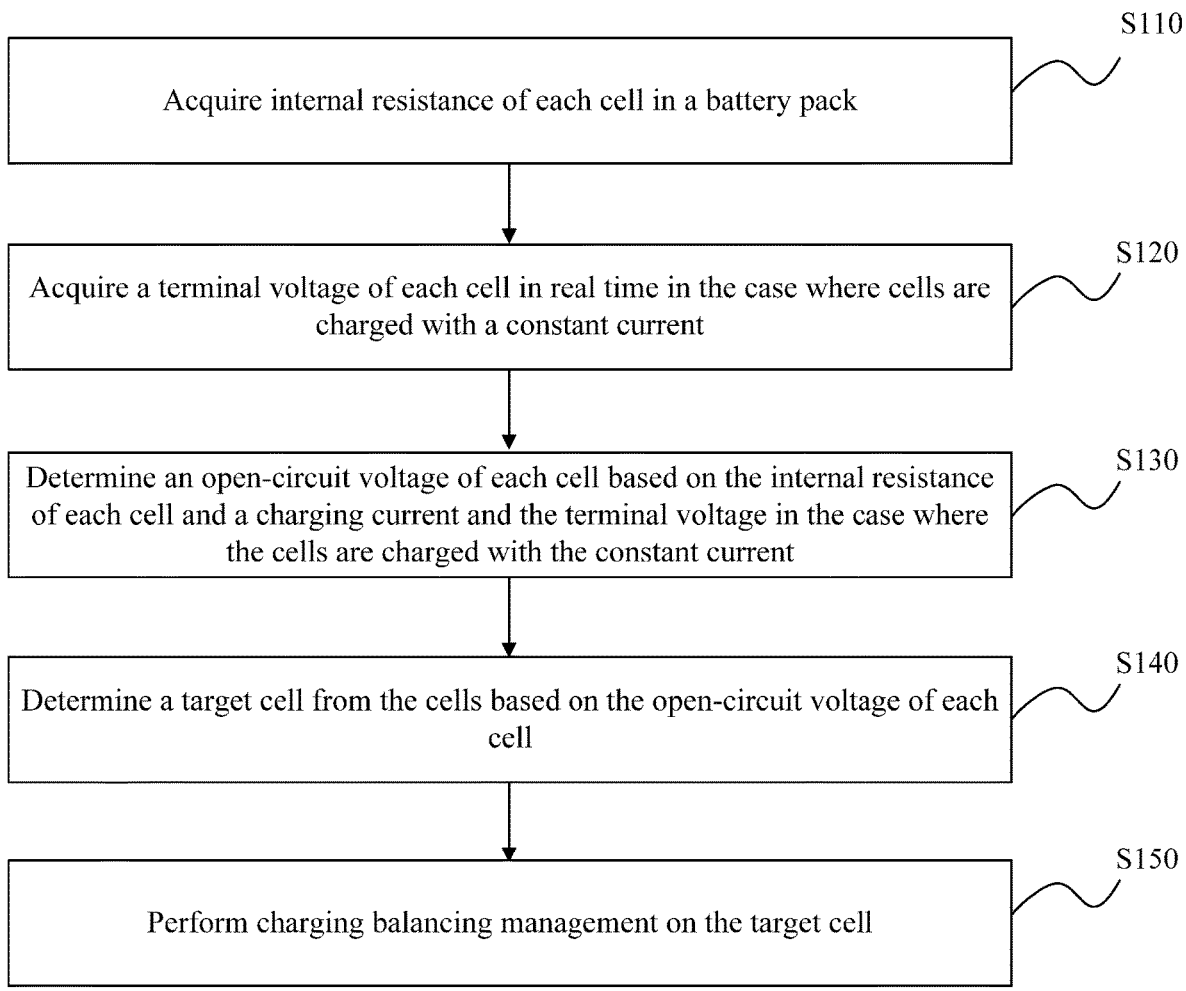
FIG. 2 is a flowchart of a charging management method according to an example of the present disclosure.

FIG. 2 is a flowchart of a charging management method according to an example. This example may be applied to balance the charging of a battery pack. For example, in the process of charging the battery pack, each cell in the battery pack is balanced and managed, so as to improve the accuracy and reliability of the balanced charging of each cell in the battery pack. This method may be performed by a charging management device such as the control module. The charging management method specifically includes steps described below.

In S110, internal resistance of each cell in the battery pack is acquired.

The battery pack includes multiple cells. Charging the battery pack means charging each cell in the battery pack. After the battery pack is used for a long time, a difference in internal resistance between cells is relatively large. Therefore, the internal resistance of each cell is acquired so that a voltage drop of the internal resistance of each cell can be determined and then an electromotive force of each cell can be determined based on the voltage drop of the internal resistance of each cell.

In an example, the step of acquiring the internal resistance of each cell specifically includes steps described below.

Current power of the battery pack is compared with a set power threshold.

Charging is stopped in the case where the current power reaches the power threshold.

A voltage variation of each cell is acquired.

The internal resistance of each cell is determined based on the voltage variation and a charging current.

The power of the battery pack may be represented by a state of charge (SoC). The value of the SoC represents the ratio of the remaining power of a battery to a capacity of the battery and is expressed as a percentage. Optionally, the power threshold of the battery pack may be selected based on whether an actual charging current is stable. For example, in the case where the charging current for charging the battery pack becomes stable, the power of the battery pack is 5%. Then the power threshold of the battery pack may be selected to be greater than or equal to 5%.

In an example, the battery pack is charged with a constant current, so the current power of the battery pack may be calculated based on charging time and the charging current, where the charging current may be detected by configuring a current detection circuit.

In the case where the current power of the battery pack reaches the power threshold, the charging is stopped. In this case, the battery pack is in an open-circuit state, so the acquired voltage of each cell is an open-circuit voltage of each cell, that is, the electromotive force. It can be known that in the case where the battery pack is charged, a terminal voltage of each cell includes the voltage drop of the internal resistance of the cell and the electromotive force of the cell. Therefore, the electromotive force of each cell and the terminal voltage of each cell when it is charged are acquired so that the voltage variation corresponding to each cell may be acquired, where the voltage variation is the voltage drop of the internal resistance of each cell. Based on the charging current and the obtained voltage variation, the internal resistance of each cell may be calculated.

In an example, the internal resistance of each cell is calculated by the following formula:

$$R=\Delta U/\Delta I \qquad (2)$$

where R denotes the internal resistance of the cell, $\Delta U$ denotes the voltage variation of the cell, and $\Delta I$ is a current variation of the cell (that is, the charging current).

For example, if the charging current of the battery pack is 2.5 A, the terminal voltage of a certain cell during stable charging is 3.5 V, and the electromotive force of the cell after charging is stopped is 3.4 V, then the voltage variation of the cell is 0.1 V. According to formula (1), the internal resistance R of the cell may be calculated as $R=0.1/2.5=0.04\Omega$.

After the voltage variation of each cell is acquired, the process of charging the battery pack is restarted.

It should be noted that in the charging process, the internal resistance of each cell only needs to be calculated once, the calculated internal resistance of each cell is used for calculating the voltage drop of the internal resistance of each cell in the subsequent charging process, and then the electromotive force of each cell is calculated.

In S120, the terminal voltage of each cell is acquired in real time in the case where each cell is charged with the constant current.

The terminal voltage of the cell refers to the voltage between the positive and negative electrodes of the cell. Exemplarily, one voltage detection circuit is connected to two ends of each cell so that the terminal voltage of each cell may be acquired in real time.

In S130, the electromotive force of each cell is determined based on the internal resistance of each cell and the charging current and the terminal voltage in the case where each cell is charged with the constant current.

After the battery pack is recharged, it can be known from the preceding analysis that the terminal voltage of each cell under this operating condition includes the voltage drop of the internal resistance of the cell and the electromotive force of the cell. The internal resistance of the cell is multiplied by the charging current at this time so that the voltage drop of the internal resistance is obtained and then the voltage drop of the internal resistance of the cell is subtracted from the terminal voltage of the cell so that the electromotive force of the cell is obtained.

In an example, the electromotive force of each cell is determined by the following formula:

$$OCV=U-R*I \quad (3)$$

where OCV denotes the electromotive force of the cell, U denotes the terminal voltage, I denotes the charging current, and R denotes the internal resistance of the cell.

For example, if the internal resistance of the cell is 40 mΩ, the current charging current is 2.5 A, and the detected terminal voltage is 4.0 V, then based on formula (2), the electromotive force of the cell may be calculated as 4.0−2.5*0.04=3.9 V.

The electromotive force of the cell is the voltage obtained after the voltage drop of the internal resistance of the cell is subtracted and thus truly reflects the effective voltage of the cell. Therefore, charging balancing management is performed on each cell based on the electromotive force of each cell, which can improve the accuracy and reliability of balanced charging.

In S140, a target cell is determined from cells based on the electromotive force of each cell.

The target cell is the cell to be balanced. Since the electromotive force of the cell truly reflects the effective voltage of the cell, the cell to be balanced, that is, the target cell, may be determined through the comparison of a voltage difference between the electromotive forces of the cells.

In an example, the step of determining the target cell specifically includes steps described below.

A minimum electromotive force is determined based on the electromotive force of each cell.

A cell whose electromotive force has a difference greater than a set voltage threshold than the minimum electromotive force is determined as the target cell.

The minimum electromotive force is determined through the comparison of the electromotive forces of the cells. In the case where a difference between the electromotive force of a certain cell and the minimum electromotive force exceeds the set voltage threshold, the cell is determined as the target cell. Further, in the case where differences between the electromotive forces of multiple cells and the minimum electromotive force are greater than the set voltage threshold, the multiple cells are all determined as the target cells. Accordingly, the charging balancing management is performed on the multiple target cells.

It is to be noted that the process of determining the target cell is a continuous process, that is, in the process of charging the battery pack, the target cell at a current charging stage is continuously determined according to the preceding method so that the determined target cell is balanced and managed in real time.

In S150, the charging balancing management is performed on the target cell.

Performing the charging balancing management on the target cell refers to discharging the target cell to adjust the electromotive force of the target cell until the difference between the electromotive force of the target cell and the minimum electromotive force is less than or equal to the set voltage threshold.

In an example, a discharge circuit is connected to two ends of each cell. Accordingly, the step of discharging the target cell specifically includes a step described below.

The discharge circuit is controlled to be connected to two ends of the target cell, where the discharge circuit includes a discharge resistor.

The discharge circuit is connected to two ends of each cell, and the discharge circuit may include a controllable switch and the discharge resistor. In the case where the controllable switch is turned off, the discharge circuit is disconnected from the corresponding cell and the discharge circuit does not function. In the case where the controllable switch is turned on, the discharge circuit communicates with the corresponding cell so that the cell is discharged through the discharge resistor. In this manner, the electromotive force of the target cell is adjusted such that the difference between the electromotive force of the target cell and the minimum electromotive force does not exceed the set voltage threshold.

In an example, the resistance of the discharge resistor is within a range of 10 K to 100 K so that the cell is slowly discharged with a small discharging current. In this manner, the following case can be avoided: the electromotive force of the cell is too small due to too large a discharging current and so the cell enters an unbalanced state again.

In this example, the target cell is determined based on the electromotive force of each cell and then the electromotive force of the target cell is adjusted by discharging the target cell so that the charging balancing management is performed on the target cell and the accuracy of the charging balancing management performed on the battery pack is improved.

The principle of the charging balancing management is as follows: in the process of charging the battery pack, the internal resistance of each cell in the battery pack is detected, the voltage drop of the internal resistance of each cell is calculated from the internal resistance, and the electromotive force of each cell is obtained so that the charging balancing management is performed on each cell based on the electromotive force of each cell.

In the examples, the internal resistance of each cell in the battery pack is acquired, the voltage drop of the internal resistance of each cell in the charging process is calculated, and then the terminal voltage of each cell is acquired so that the electromotive force of each cell is calculated; the terminal voltage of each cell is acquired in real time and the electromotive force of each cell may be calculated in real time so that the cell to be balanced and managed is determined based on the electromotive force of each cell and then the cell is balanced and managed. The electromotive force of each cell calculated in this example is the effective voltage of the cell obtained after the voltage drop of the internal resistance of the cell is subtracted. Therefore, the electromotive force of each cell can truly reflect the current voltage state of each cell. In this manner, the charging balancing management is performed on each cell based on the electromotive force so that the cell to be balanced and managed can be accurately determined and then the charging balancing management is performed on the cell, thereby improving the accuracy and reliability of the balanced charging.

It is to be noted that the above are merely preferred examples. It is to be understood by those skilled in the art that the claimed invention is not limited to the examples described herein. Those skilled in the art can make various apparent modifications, adaptations, and substitutions without departing from the scope of the claimed invention. Therefore, while the claimed invention has been described in detail through the preceding examples, the claimed invention is not limited to the preceding examples and may include more other equivalent examples without departing from the concept of the claimed invention.

What is claimed is:

1. A battery pack, comprising:
a housing, a cell group, and a control module that are disposed in the housing, wherein the cell group is configured to output a power signal and comprises a plurality of cells and the control module is configured to:
compute an internal resistance of each of the plurality of cells by comparing a current power of the battery pack with a set power threshold, stopping charging where the current power of the battery pack is substantially equal to the set power threshold, determine a voltage variation of each of the plurality of cells, and determining the internal resistance of each of the plurality of cells based on the voltage variation and a charging current;
determine a terminal voltage of each of the plurality of cells in real time in a case where the plurality of cells are charged with a constant current;
compute an electromotive force of each of the plurality of cells based on the internal resistance of each of the plurality of cells and a charging current and the terminal voltage in the case where the plurality of cells are charged with the constant current;
determine a target cell from the plurality of cells based on the electromotive force of each of the plurality of cells; and
perform charging balancing management on the target cell,
wherein, the housing is provided with a battery pack coupling part, and the battery pack is coupleable to an electric power tool through the battery pack coupling part so that the electric power tool is powered by the battery pack.

2. The battery pack of claim 1, further comprising a plurality of voltage detection modules, wherein each of the plurality of cells is connected to the control module through one of the plurality of voltage detection modules and the control module detects a voltage of each of the plurality of cells through the one of the plurality of voltage detection modules.

3. The battery pack of claim 1, further comprising a plurality of current detection modules, wherein each of the plurality of cells is connected to the control module through one of the plurality of current detection modules and the control module detects a charging current of each of the plurality of cells through the one of the plurality of current detection modules.

4. The battery pack of claim 1, further comprising a plurality of discharge circuits that are connected in correspondence to the plurality of cells, wherein one end of each of the plurality of discharge circuits is connected to a positive electrode of a respective one of the plurality of cells and another end of each of the plurality of discharge circuits is connected to a negative electrode of the respective one of the plurality of cells, each of the plurality of discharge circuits comprises a controllable switch and a resistor that are arranged in series, a control end of the controllable switch is connected to the control module, and each of the plurality of discharge circuits is configured to control the respective one of the plurality of cells to be discharged in response to the control module.

5. The battery pack of claim 1, wherein the control module is further configured to compute the electromotive force of each of the plurality of cells by using he formula $OCV=U-R*I$ wherein OCV denotes the electromotive force of each of the plurality of cells, U denotes the terminal voltage, I denotes the charging current, and R denotes the internal resistance of each of the plurality of cells.

6. The battery pack of claim 1, wherein the control module is further configured to determine a minimum electromotive force based on the electromotive force of each of the plurality of cells and determine a cell whose electromotive force has a difference greater than a set voltage threshold than the minimum electromotive force as the target cell.

7. The battery pack of claim 6, wherein the control module is further configured to discharge the target cell until a difference between an electromotive force of the target cell and the minimum electromotive force is less than or equal to the set voltage threshold to perform the charging balancing management on the target cell.

8. A charging management method, comprising:
computing an internal resistance of each cell of a plurality of cells in a battery pack;
determining a terminal voltage of each cell in real time in a case where the plurality of cells are charged with a constant current;
calculating an electromotive force of each cell based on the internal resistance of each cell and a charging current and the terminal voltage in the case where the plurality of cells are charged with the constant current;
determining a target cell from the plurality of cells based on the electromotive force of each cell; and
performing charging balancing management on the target cell, and
wherein determining the target cell from the plurality of cells based on the electromotive force of each cell comprises determining a minimum electromotive force based on the electromotive force of each cell and determining a cell whose electromotive force has a difference greater than a set voltage threshold than the minimum electromotive force as the target cell.

9. The charging management method of claim 8, wherein computing the internal resistance of each cell in the battery pack comprises comparing current power of the battery pack with a set power threshold, stopping charging the battery pack in a case where the current power reaches the power threshold, acquiring a voltage variation of each cell, and determining the internal resistance of each cell based on the voltage variation and the charging current.

10. The charging management method of claim 8, wherein the electromotive force of each cell is calculated by using the formula $OCV=U-R*I$ wherein OCV denotes the electromotive force of each cell, U denotes the terminal voltage, I denotes the charging current, and R denotes the internal resistance of each cell.

11. The charging management method of claim 8, wherein performing the charging balancing management on the target cell comprises discharging the target cell until a difference between the electromotive force of the target cell and the minimum electromotive force is less than or equal to the set voltage threshold.

12. The charging management method of claim 11, wherein discharging the target cell comprises controlling a discharge circuit to be connected to two ends of the target cell and the discharge circuit comprises a discharge resistor.

* * * * *